United States Patent
Trinh et al.

(10) Patent No.: US 10,658,581 B2
(45) Date of Patent: May 19, 2020

(54) SEMICONDUCTOR DEVICE STRUCTURE WITH MULTIPLE RESISTANCE VARIABLE LAYERS

(71) Applicant: TAIWAN SEMICONDUCTOR MANUFACTURING CO., LTD., Hsinchu (TW)

(72) Inventors: Hai-Dang Trinh, Hsinchu (TW);
Hsing-Lien Lin, Hsinchu (TW);
Chii-Ming Wu, Taipei (TW);
Cheng-Yuan Tsai, Chupei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/896,134

(22) Filed: Feb. 14, 2018

(65) Prior Publication Data

US 2019/0157553 A1    May 23, 2019

Related U.S. Application Data

(60) Provisional application No. 62/587,570, filed on Nov. 17, 2017.

(51) Int. Cl.
| | |
|---|---|
| *G11C 11/56* | (2006.01) |
| *G11C 13/00* | (2006.01) |
| *H01L 45/00* | (2006.01) |

(52) U.S. Cl.
CPC ...... *H01L 45/1233* (2013.01); *G11C 11/5685* (2013.01); *G11C 13/0007* (2013.01); *H01L 45/08* (2013.01); *H01L 45/146* (2013.01); *H01L 45/1616* (2013.01); *H01L 45/1675* (2013.01)

(58) Field of Classification Search
CPC ............. H01L 45/1233; H01L 45/1616; G11C 11/5685; G11C 13/0007
USPC .......................................................... 257/4
See application file for complete search history.

(56) References Cited

U.S. PATENT DOCUMENTS

| | | | |
|---|---|---|---|
| 9,461,245 B1 * | 10/2016 | Yang | H01L 45/1253 |
| 2015/0255718 A1 * | 9/2015 | Liu | H01L 45/122 257/4 |
| 2016/0049584 A1 * | 2/2016 | Dang | H01L 45/08 257/4 |
| 2016/0218283 A1 * | 7/2016 | Trinh | H01L 45/08 |

* cited by examiner

*Primary Examiner* — Didarul A Mazumder
(74) *Attorney, Agent, or Firm* — Birch, Stewart, Kolasch & Birch, LLP

(57) ABSTRACT

A semiconductor device structure is provided. The semiconductor device structure includes a semiconductor substrate and a lower electrode over the semiconductor substrate. The semiconductor device structure also includes a first oxide layer over the lower electrode, a second oxide layer over the first oxide layer, and a third oxide layer over the second oxide layer. Oxygen ions are bonded more tightly in the second oxide layer than those in the first oxide layer, and oxygen ions are bonded more tightly in the second oxide layer than those in the third oxide layer. The semiconductor device structure further includes an upper electrode over the third oxide layer.

20 Claims, 15 Drawing Sheets

SEMICONDUCTOR DEVICE STRUCTURE WITH MULTIPLE RESISTANCE VARIABLE LAYERS

PRIORITY CLAIM AND CROSS-REFERENCE

This Application claims the benefit of U.S. Provisional Application No. 62/587,570, filed on Nov. 17, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
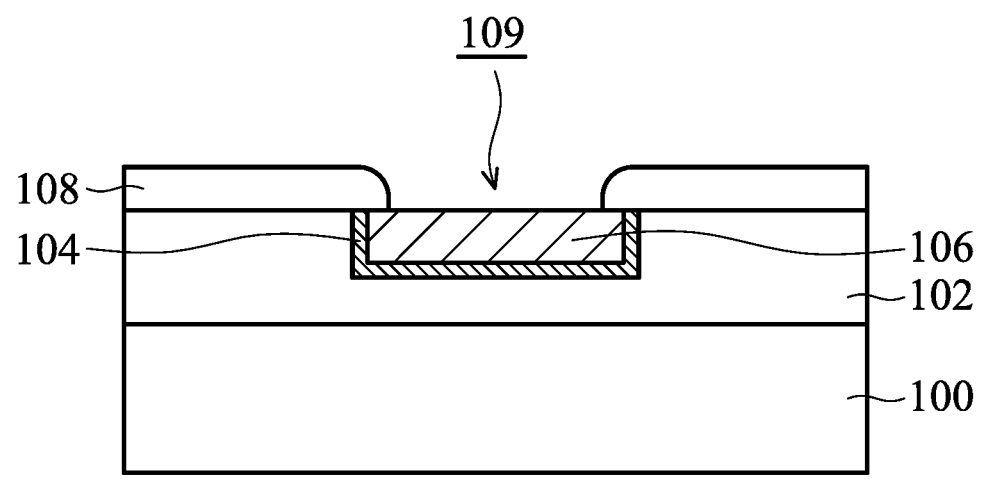
FIGS. 1A-1J are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a semiconductor device structure, in accordance with some embodiments. In some embodiments, the semiconductor device structure to be formed includes a metal-insulator-metal (MIM) structure of a resistive random access memory (RRAM) structure. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

In some embodiments, various device elements are formed in and/or on the semiconductor substrate 100. Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

In some embodiments, a dielectric layer 102 is formed over the semiconductor substrate 100, as shown in FIG. 1A. The dielectric layer 102 may include multiple sub-layers. The dielectric layer 102 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof.

In some embodiments, multiple conductive features are formed in the dielectric layer 102. The conductive features may include conductive contacts, conductive lines, and/or conductive vias. The dielectric layer 102 and the conductive features formed therein are a portion of an interconnection structure that will be subsequently formed. The formation of the dielectric layer 102 and the conductive features in the dielectric layer 102 may involve multiple deposition processes, patterning processes, and planarization processes. The device elements in and/or on the semiconductor substrate 100 will be interconnected through the interconnection structure to be formed over the semiconductor substrate 100.

In some embodiments, a conductive feature 106 is formed in the dielectric layer 102, as shown in FIG. 1A. The conductive feature 106 may be a conductive line. In some embodiments, a barrier layer 104 is formed between the conductive feature 106 and the dielectric layer 102. The barrier layer 104 may be used to prevent metal ions of the conductive features 106 from diffusing into the dielectric layer 102.

In some embodiments, trenches are formed in the dielectric layer 102. Each of the trenches may connect a via hole (not shown). The trenches are used to contain conductive lines and the barrier layer. The formation of the trenches may involve photolithography processes and etching processes. Afterwards, the barrier layer 104 is deposited over the dielectric layer 102. The barrier layer 104 extends on sidewalls and bottom portions of the trenches. The barrier layer 104 may be made of or include tantalum nitride, titanium nitride, one or more other suitable materials, or a combination thereof. The barrier layer 104 may be deposited using a chemical vapor deposition (CVD) process, an atomic layer deposition (ALD) process, a physical vapor deposition (PVD) process, an electroplating process, an electroless plating process, one or more other applicable processes, or a combination thereof.

Afterwards, a conductive material layer is deposited over the barrier layer 104 to fill the trenches, in accordance with some embodiments. The conductive material layer may be made of or include copper, cobalt, tungsten, titanium, nickel, gold, platinum, graphene, one or more other suitable materials, or a combination thereof. The conductive material layer may be deposited using a CVD process, an ALD process, a PVD process, an electroplating process, an electroless plating process, one or more other applicable processes, or a combination thereof.

Afterwards, the barrier layer 104 and the conductive material layer outside of the trenches are removed, in accordance with some embodiments. Remaining portions of the conductive material layer in one of the trenches form the conductive feature 106. In some embodiments, the barrier layer 104 and the conductive material layer outside of the trenches are removed using a planarization process. The planarization process may include a CMP process, a dry polishing process, a mechanical grinding process, an etching process, one or more other applicable processes, or a combination thereof.

As shown in FIG. 1A, a dielectric layer 108 is deposited over the dielectric layer 102 and the conductive feature 106, in accordance with some embodiments. The dielectric layer 108 may be made of or include silicon carbide (SiC), nitrogen-doped silicon carbide, oxygen-doped silicon carbide, silicon nitride (SiN), silicon oxynitride (SiON), silicon oxide, one or more other suitable materials, or a combination thereof. The dielectric layer 108 may be deposited using a CVD process, an ALD process, a PVD process, one or more other applicable processes, or a combination thereof. In some embodiments, the dielectric layer 108 is patterned to form an opening 109 that exposes the conductive feature 106, as shown in FIG. 1A.

Figure 1B:
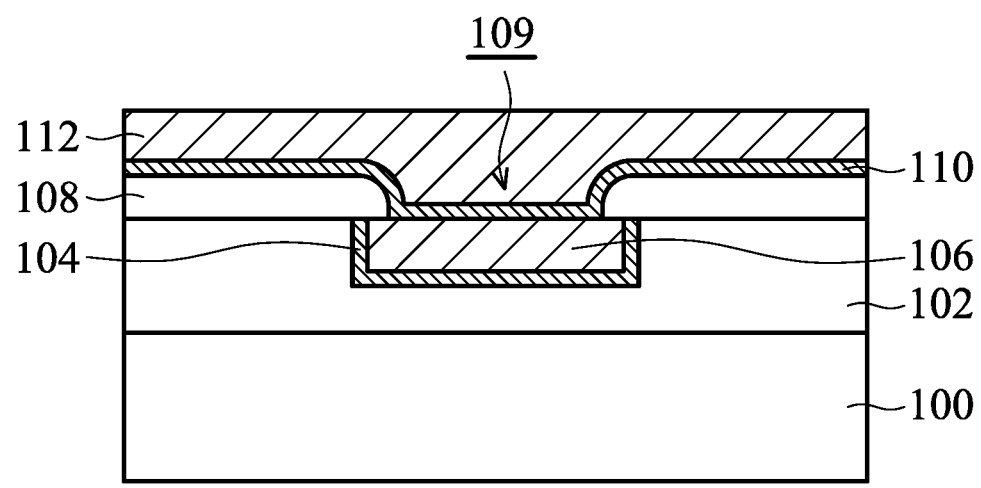

As shown in FIG. 1B, a barrier layer 110 is deposited over the dielectric layer 108, in accordance with some embodiments. The barrier layer 110 extends on the sidewalls and bottom portion of the opening 109. The barrier layer 110 may be made of or include tantalum nitride, titanium nitride, one or more other suitable materials, or a combination thereof. The barrier layer 110 may be deposited using a chemical vapor deposition (CVD) process, an atomic layer deposition (ALD) process, a physical vapor deposition (PVD) process, an electroplating process, an electroless plating process, one or more other applicable processes, or a combination thereof.

Afterwards, a conductive layer 112 is deposited over the barrier layer 110, as shown in FIG. 1B in accordance with some embodiments. The conductive layer 112 may fill the opening 109. The conductive layer 112 is used as a lower electrode layer of a memory device that will be formed. The conductive layer 112 may be made of or include copper, cobalt, tungsten, titanium, nickel, gold, platinum, graphene, one or more other suitable materials, or a combination thereof. The conductive layer 112 may be deposited using a CVD process, an ALD process, a PVD process, an electroplating process, an electroless plating process, one or more other applicable processes, or a combination thereof.

In some embodiments, the conductive layer 112 is planarized to provide the conductive layer 112 with a substantially planarized surface, which may facilitate subsequent formation processes. The conductive layer 112 may be planarized using a chemical mechanical polishing (CMP) process, a grinding process, a dry polishing process, an etching process, one or more other applicable processes, or a combination thereof.

In accordance with some embodiments, three or more resistance variable layers are stacked together to serve as a data storage element. The data storage element may have a small thickness to achieve a lower forming voltage of an RRAM device. Due to the multiple resistance variable layers, the leakage current may be significantly reduced, which leads to a better switching control. In some other cases in which only one thin single resistance variable layer is formed, the leakage current may be high, which may negatively affect the device performance.

Figure 1C:
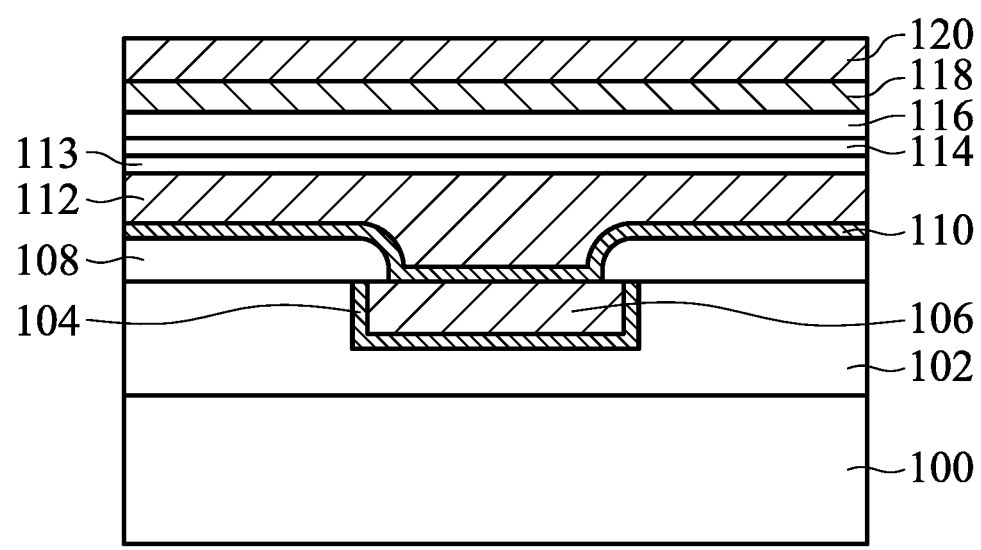

As shown in FIG. 1C, a stack of resistance variable layers is formed over the conductive layer 112, in accordance with some embodiments. In some embodiments, the stack includes resistance variable layers 113, 114, and 116. The resistance variable layers 113, 114, and 116 together serve as a data storage element which is configured to store data unit. Each of the resistance variable layers 113, 114, and 116 has variable resistance. Depending upon the voltage applied across the resistance variable layers 113, 114, and 116, the total resistance of the resistance variable layers 113, 114, and 116 can be switched between different resistance states corresponding to different data states of the data unit.

Each of the resistance variable layers 113, 114, and 116 may have reduced resistance after a sufficiently high voltage is applied. The applied voltage may induce ions (such as oxygen ions) in the resistance variable layers 113, 114, and 116 to move to the electrodes. As a result, a series of vacancies are formed in the resistance variable layers 113, 114, and 116. After the number of the vacancies is increased to a sufficiently high amount, these vacancies may link together to form one or more conductive paths. For example, through a forming process, one or more conductive paths (for example, conductive filaments) may be formed in the resistance variable layers 113, 114, and 116 so that the total resistance of the resistance variable layers 113, 114, and 116 is reduced significantly.

A reverse voltage may be applied such that the oxygen ions go back to the resistance variable layers 113, 114, and 116, which may partially destroy the formed conductive filaments or the conductive paths. As a result, the total resistance of the resistance variable layers 113, 114, and 116 is increased.

As mentioned above, the total resistance of the resistance variable layers 113, 114, and 116 may be adjusted through the application of voltage. The data may be stored in the resistance variable layers 113, 114, and 116. By detecting the current passing through the resistance variable layers 113, 114, and 116, information about the resistance state of the resistance variable layers 113, 114, and 116 is obtained. Therefore, the stored data is also obtained correspondingly.

In some embodiments, each of the resistance variable layers 113, 114, and 116 is made of a dielectric material and is usually electrically insulating. Each of the resistance variable layers 113, 114, and 116 may be made of or include an oxide material such as a metal oxide material. In some embodiments, each of the resistance variable layers 113, 114, and 116 is made of an oxygen-containing dielectric material.

In some embodiments, the middle resistance variable layer 114 has different characteristics than that of the resistance variable layers 113 and 116. In some embodiments, the composition of the resistance variable layer 114 is different than that of the resistance variable layer 113 or 116. In some embodiments, the material of the resistance variable layer 114 has better retention than that of the resistance variable layer 113 or 116. In some embodiments, the material of the resistance variable layer 113 or 116 has lower leakage current than that of the resistance variable layer 114. The combination of the resistance variable layers 113, 114, and 116 may yield good retention and low leakage current. In some embodiments, oxygen ions are bonded more tightly in the resistance variable layer 114 than those in the resistance variable layer 113 or 116.

In some embodiments, each of the resistance variable layers 113, 114, and 116 is an oxide layer containing elements respectively selected from a first group of elements and a second group of elements. In some embodiments, the first group of elements includes aluminum, silicon, tantalum, yttrium, and vanadium. In some embodiments, the second group of elements includes zirconium, hafnium, titanium, lanthanum, and tantalum.

In some embodiments, the resistance variable layer 113 is an oxide layer containing a first element and a second element other than the first element. In some embodiments, the first element is selected from one of the first group of elements, and the second element is selected from one of the second group of elements. The bonding strength between oxygen and the element selected from the first group of element may be greater than that between oxygen and the element selected from the second group of elements. The bonding strength between the first element and oxygen may be greater than a bonding strength between the second element and oxygen. In some embodiments, the resistance variable layer 113 has a greater atomic concentration of the second element than that of the first element. In some embodiments, a ratio of the atomic concentration of the first element to a total atomic concentration of the first element and the second element is in a range from about 20% to about 50%. In the resistance variable layer 113, the ratio of the atomic concentration of the first element to the atomic concentration of the second element may be in a range from about 0.25 to about 1.

In some embodiments, the resistance variable layer 114 is an oxide layer containing a third element and a fourth element other than the third element. In some embodiments, the third element is selected from one of the first group of elements, and the fourth element is selected from one of the second group of elements. The bonding strength between the third element and oxygen may be greater than a bonding strength between the fourth element and oxygen.

In some embodiments, the first element of the resistance variable layer 113 and the third element of the resistance variable layer 114 are the same element selected from one of the first group of elements. In some other embodiments, the first element and the third element are different elements selected from two of the first group of elements. In some embodiments, the second element of the resistance variable layer 113 and the fourth element of the resistance variable layer 114 are the same element selected from one of the second group of elements. In some other embodiments, the second element and the fourth element are different elements selected from two of the second group of elements.

In some embodiments, the resistance variable layer 114 has a greater atomic concentration of the third element than that of the fourth element. In some embodiments, a ratio of the atomic concentration of the third element to a total atomic concentration of the third element and the fourth element is in a range from about 55% to about 80%. In the resistance variable layer 114, the ratio of the atomic concentration of the third element to the atomic concentration of the fourth element may be in a range from about 1.2 to about 4.

In some embodiments, the resistance variable layer 116 is an oxide layer containing a fifth element and a sixth element other than the fifth element. In some embodiments, the fifth element is selected from one of the first group of elements, and the sixth element is selected from one of the second group of elements. The bonding strength between the fifth element and oxygen may be greater than a bonding strength between the sixth element and oxygen.

In some embodiments, the fifth element of the resistance variable layer 116 and the third element of the resistance variable layer 114 are the same element selected from one of the first group of elements. In some other embodiments, the fifth element and the third element are different elements selected from two of the first group of elements. In some embodiments, the sixth element of the resistance variable layer 116 and the fourth element of the resistance variable layer 114 are the same element selected from one of the second group of elements. In some other embodiments, the sixth element and the fourth element are different elements selected from two of the second group of elements.

In some embodiments, the resistance variable layer 116 has a greater atomic concentration of the sixth element than that of the fifth element. In some embodiments, a ratio of the atomic concentration of the fifth element to a total atomic concentration of the fifth element and the sixth element is in a range from about 20% to about 50%. In the resistance variable layer 116, the ratio of the atomic concentration of the fifth element to the atomic concentration of the sixth element is in a range from about 0.25 to about 1.

In some embodiments, the atomic concentration of the third element of the resistance variable layer 114 is greater than the atomic concentration of the first element of the resistance variable layer 113. In some embodiments, the atomic concentration of the third element of the resistance variable layer 114 is greater than the atomic concentration of the fifth element of the resistance variable layer 116. As mentioned above, the bonding strength between oxygen and the element selected from the first group of element may be greater than that between oxygen and the element selected from the second group of elements. Since the resistance variable layer 114 has a greater atomic concentration of element selected from the first group of elements than that of the resistance variable layer 113 or 116, oxygen ions are bonded more tightly in the resistance variable layer 114 than those in the resistance variable layer 113 or 116.

In some embodiments, the total thickness of the resistance variable layers 113, 114, and 116 is in a range from about 60 nm to about 120 nm. In some embodiments, the resistance variable layers 113, 114, and 116 have substantially the same thickness. However, many variations and/or modifications can be made to embodiments of the disclosure. In some other embodiments, the resistance variable layers 113, 114, and 116 have different thicknesses. In some embodiments, the resistance variable layer 116 is thicker than the resistance variable layer 114 or 113. In some embodiments, the ratio of the thickness of the resistance variable layer 116 to the thickness of the resistance variable layer 114 is in a range from about 1.2 to about 2. In some cases, if the ratio is smaller than about 1.2, the reliability of the semiconductor device structure may not be sufficient. In some other cases, if the ratio is greater than about 2, the forming voltage of the semiconductor device structure may be too high. The operation speed may also be not high enough.

Many methods may be used to form the resistance variable layers 113, 114, and 116. In some embodiments, each of the resistance variable layers 113, 114, and 116 is deposited using an ALD process, a CVD process, a PVD process, a spin-on process, a spraying coating process, one or more other applicable processes, or a combination thereof.

In some embodiments, the resistance variable layer 113 is in direct contact with the conductive layer 112 which serves as a lower electrode layer. In some embodiments, due to the substantially planar surface provided by the planarized conductive layer 112, adhesion between the resistance variable layer 113 and the conductive layer 112 is improved.

As shown in FIG. 1C, a capping layer 118 is afterwards deposited over the resistance variable layer 116, in accordance with some embodiments. In some embodiments, the capping layer 118 is used as an ion reservoir region. The capping layer 118 may induce the formation of vacancies in the resistance variable layers 113, 114, and 116 during subsequent forming process and/or setting process. For example, the capping layer 118 is used to receive oxygen ions from the resistance variable layers 113, 114, and 116. As a result, vacancies forming the conductive paths or conductive filaments are formed in the resistance variable layers 113, 114, and 116. The forming and/or setting processes may therefore be achieved.

In some embodiments, the capping layer 118 is formed to have an appropriate thickness that is in a range from about 10 Å to about 150 Å. In some cases, if the thickness of the capping layer 118 is smaller than about 10 Å, the capping layer 118 may not be able to contain a sufficient amount of oxygen ions from the resistance variable layers 113, 114, and 116. As a result, the forming and/or setting processes may not be easy to perform. In some other cases, if the thickness of the capping layer 118 is greater than about 150 Å, the operation speed for the reset process may be slowed down. In some embodiments, the ratio of the total thickness of the resistance variable layers 113, 114, and 116 to the thickness of the capping layer 118 is in a range from about 0.02 to about 0.2.

In some embodiments, the capping layer 118 is made of a metal material. In some embodiments, the capping layer 118 is made of or includes titanium (Ti), hafnium (Hf), zirconium (Zr), lanthanum (La), tantalum (Ta), nickel (Ni), tungsten (W), one or more other suitable metal materials, or a combination thereof. In some embodiments, the capping layer 118 is made of a pure metal material or a combination of pure metal materials. In some embodiments, the capping layer 118 includes substantially no nitrogen or carbon. In some embodiments, the capping layer 118 is deposited using a PVD process, a CVD process, an ALD process, a plating process, one or more other applicable processes, or a combination thereof.

Afterwards, a conductive layer 120 is deposited over the capping layer 118, as shown in FIG. 1C in accordance with some embodiments. The conductive layer 120 is used as an upper electrode layer of a memory device that will be formed. The conductive layer 120 may be made of or include copper, cobalt, tungsten, titanium, nickel, gold, platinum, graphene, one or more other suitable materials, or a combination thereof. The conductive layer 120 may be deposited using a CVD process, an ALD process, a PVD process, an electroplating process, an electroless plating process, one or more other applicable processes, or a combination thereof.

Figure 1D:
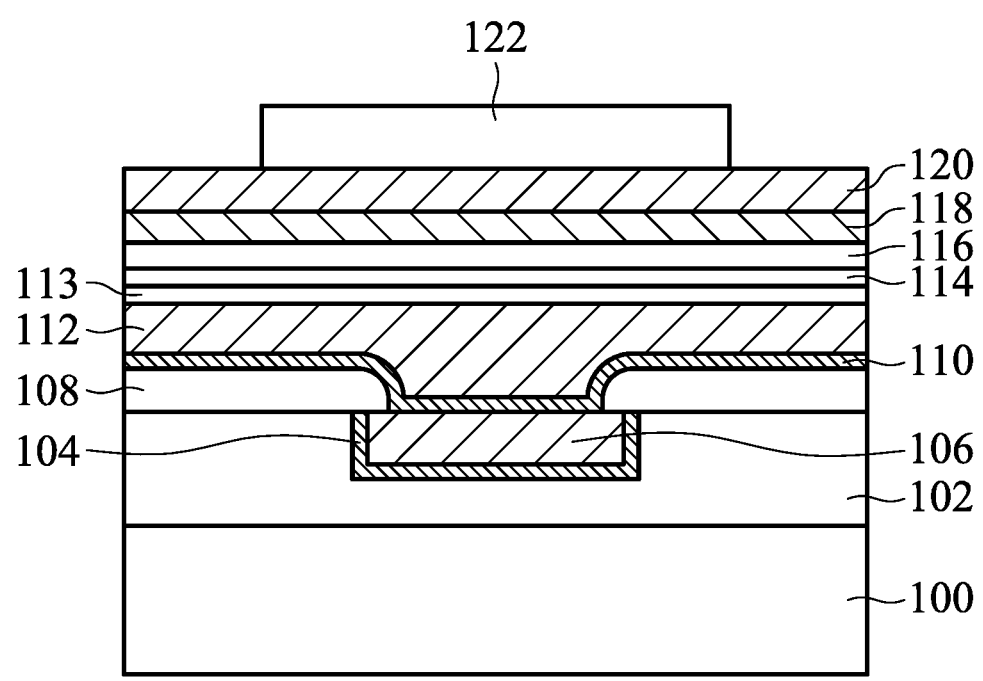

As shown in FIG. 1D, a mask element 122 is formed over the conductive layer 120, in accordance with some embodiments. The mask element 122 is used to assist in subsequent patterning process of the conductive layer 120 and the capping layer 118. The mask element 122 may be made of or include silicon nitride, silicon oxynitride, silicon oxide, one or more other suitable materials, or a combination thereof. A photolithography process and an etching process may be used to form the mask element 122.

Many variations and/or modifications can be made to embodiments of the disclosure. In some other embodiments, the mask element 122 is not formed.

Figure 1E:
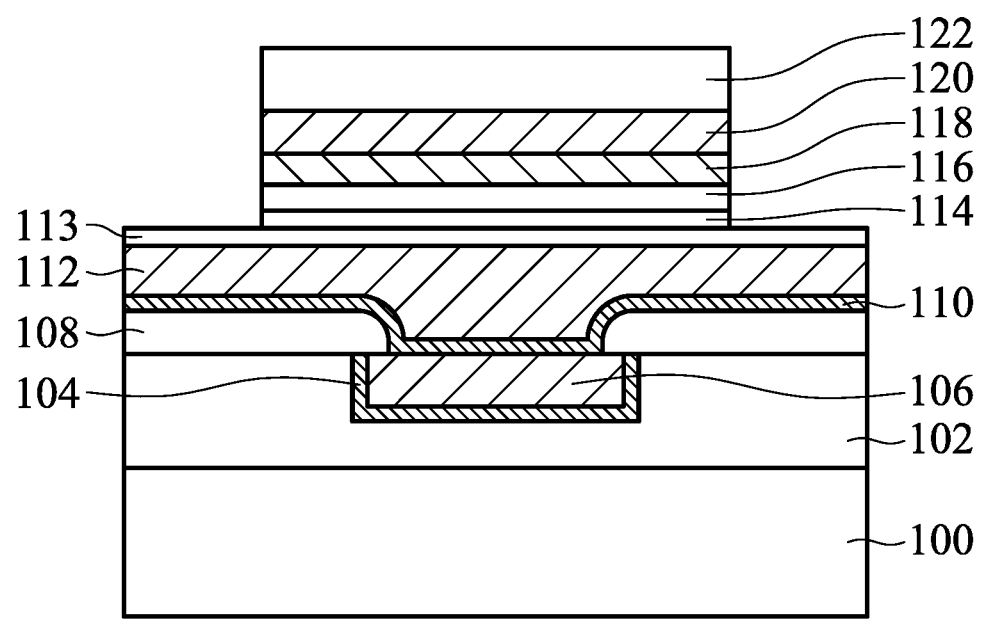

As shown in FIG. 1E, the conductive layer 120 and the capping layer 118 are partially removed to be patterned, in accordance with some embodiments. After the patterning processes, the resistance variable layers 113, 114, and 116 are exposed. In some embodiments, the conductive layer 120 and the capping layer 118 are partially removed using one or more etching processes. In some embodiments, the resistance variable layers 114, and 116 are also partially removed during the patterning of the conductive layer 120 and the capping layer 118. In some embodiments, the sidewalls of the resistance variable layer 116 and 114 and the upper surface of the resistance variable layer 113 are exposed after the one or more etching processes.

Figure 1F:
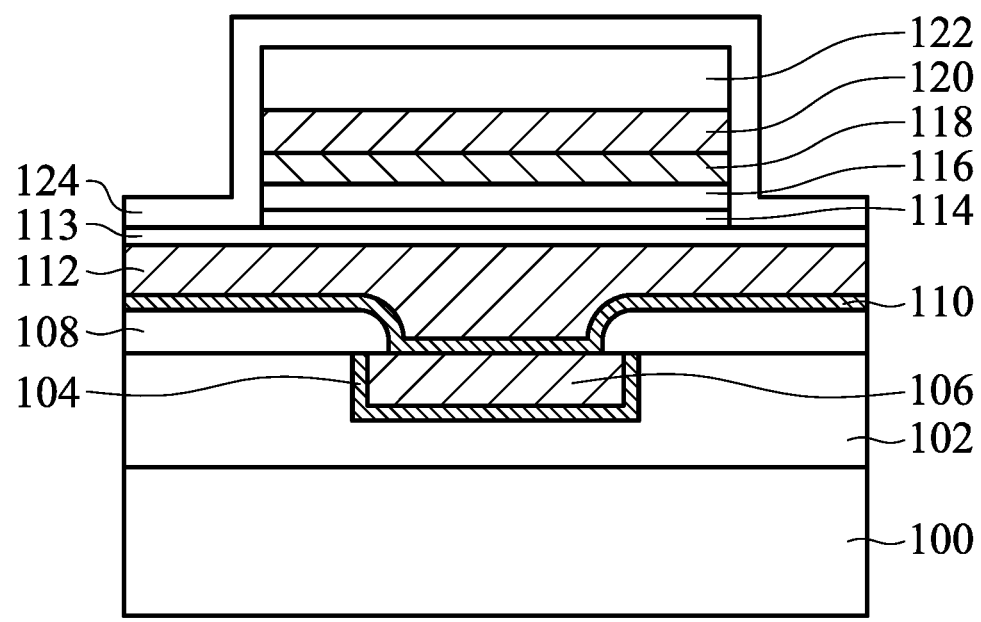

As shown in FIG. 1F, a protective layer 124 is deposited over the structure shown in FIG. 1E, in accordance with some embodiments. The protective layer 124 may be made of or include silicon nitride, silicon oxynitride, silicon oxide, one or more other suitable materials, or a combination thereof. In some embodiments, the protective layer 124 is deposited using a CVD process, an ALD process, a spin-on process, a PVD process, one or more other applicable processes, or a combination thereof.

Figure 1G:
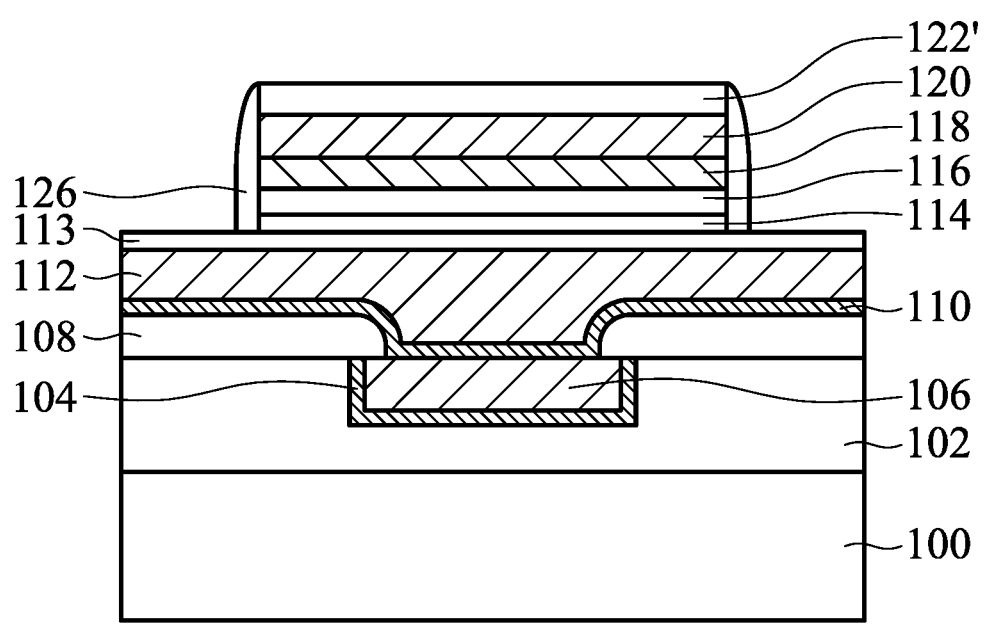

As shown in FIG. 1G, the protective layer 124 is partially removed to form a protective element 126, in accordance with some embodiments. The protective element 126 covers sidewalls of the conductive layer 120, the capping layer 118, and the resistance variable layers 116 and 114. An etching process may be used to form the protective element 126. During the etching process, the mask element 122 may also be etched. As a result, a mask element 122' with a smaller thickness may be formed. In some other embodiments, the mask element 122 is completely removed during the etching process for forming the protective element 126.

Many variations and/or modifications can be made to embodiments of the disclosure. In some other embodiments, the protective layer 124 or the protective element 126 is not formed.

Figure 1H:
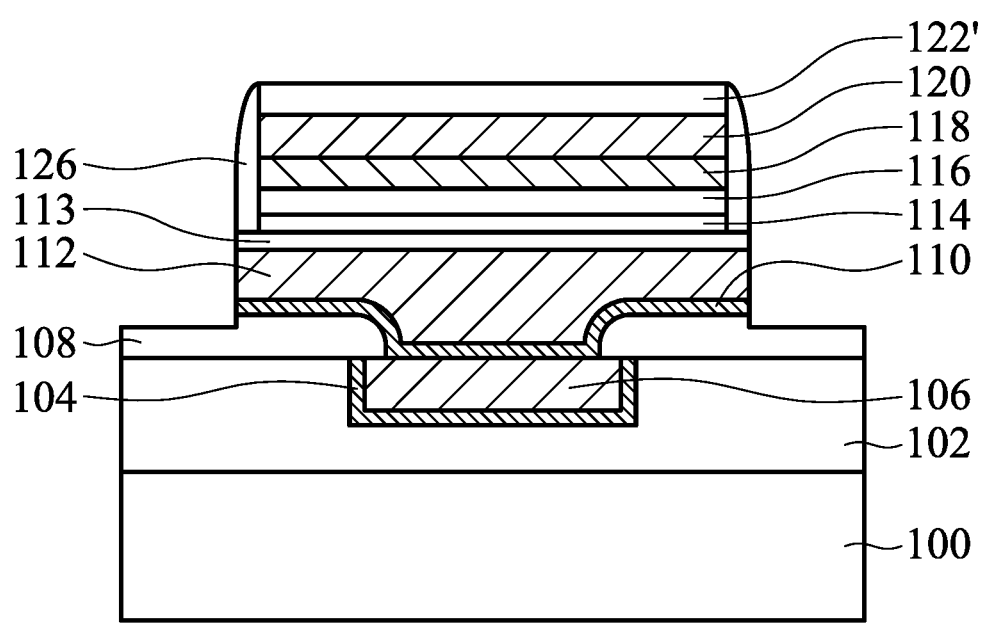

As shown in FIG. 1H, the resistance variable layer 113, the conductive layer 112, and the barrier layer 110 are partially removed to be patterned, in accordance with some embodiments. In some embodiments, the resistance variable layer 113, the conductive layer 112, and the barrier layer 110 are partially removed using one or more etching processes. The protective element 126 and the mask element 122' may together function as an etching mask during the patterning of the resistance variable layer 113, the conductive layer 112, and the barrier layer 110.

Figure 1I:
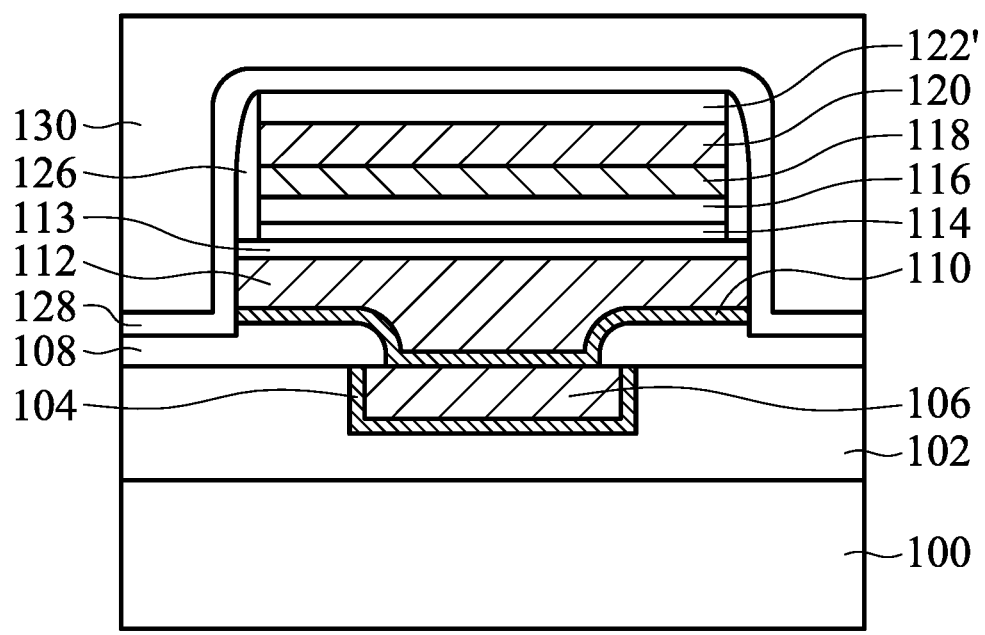

As shown in FIG. 1I, a protective layer 128 is deposited over the structure shown in FIG. 1H, in accordance with some embodiments. In some embodiments, the protective layer 128 contains silicon, oxygen, and/or carbon. The protective layer 128 may be made of or include silicon oxide, silicon nitride, silicon carbide, silicon oxynitride, one or more other suitable materials, or a combination thereof. In some embodiments, the protective layer 128 is made of a material that is substantially free of oxygen. In some embodiments, the protective layer 128 is a single layer. In some other embodiments, the protective layer 128 includes multiple sub-layers. The sub-layers may be made of the same material. Alternatively, some of the sub-layers are made of different materials. The protective layer 128 may be deposited using a CVD process, an ALD process, a PVD process, a spin-on process, one or more other applicable processes, or a combination thereof.

Afterwards, a dielectric layer 130 is deposited over the protective layer 128, as shown in FIG. 1I in accordance with some embodiments. The dielectric layer 130 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof. The dielectric layer 130 may be deposited using a CVD process, an ALD process, a PVD process, a spin-on process, a spray coating process, one or more other applicable processes, or a combination thereof.

Figure 1J:
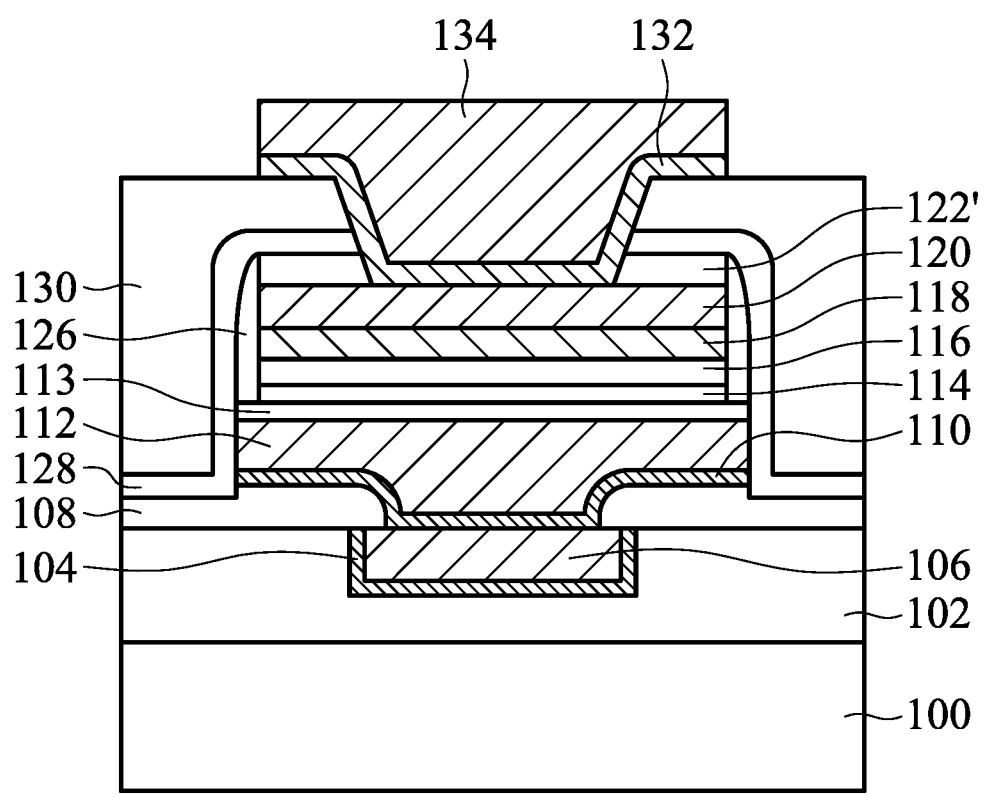

As shown in FIG. 1J, a conductive feature 134 is formed in the dielectric layer 130, in accordance with some embodiments. The conductive feature 134 is electrically connected to the conductive layer 120. In some embodiments, the conductive feature 134 is a conductive via. In some embodiments, the conductive feature 134 is a conductive line. In some embodiments, the conductive feature 134 is a combination of a conductive via and a conductive line which is formed using a dual damascene process.

In some embodiments, a barrier layer 132 is formed before the formation of the conductive feature 134. The material and formation method of the barrier layer 132 may be the same as or similar to those of the barrier layer 104. The material and formation method of the conductive feature 134 may be the same as or similar to those of the conductive feature 106.

As shown in FIG. 1J, a semiconductor device with a resistive random access memory (RRAM) structure is formed, in accordance with some embodiments. The conductive layers 112 and 120 serve as a lower electrode and an upper electrode, respectively. The conductive layers 112 and 120 sandwich the resistance variable layers 113, 114, and 116, and the capping layer 118. The RRAM structure employs oxygen vacancies to manipulate the resistance of the resistance variable layers 113, 114, and 116. When a set voltage is applied across the conductive layers 112 and 120, ions such as oxygen ions in the resistance variable layers 113, 114, and 116 move through the resistance variable layer 116 to the capping layer 118, thereby re-forming conductive paths (initially formed by a forming voltage) from oxygen vacancies and switching the variable resistance to the low resistance state. The set voltage is, for example, a positive voltage. When a reset voltage is applied across the conductive layers 120 and 112, the ions such as oxygen ions move back to the resistance variable layers 113, 114, and 116 through the resistance variable layer 116, thereby filling the oxygen vacancies and switching the variable resistance to the high resistance state. The reset voltage is, for example, a negative voltage.

Figure 2:
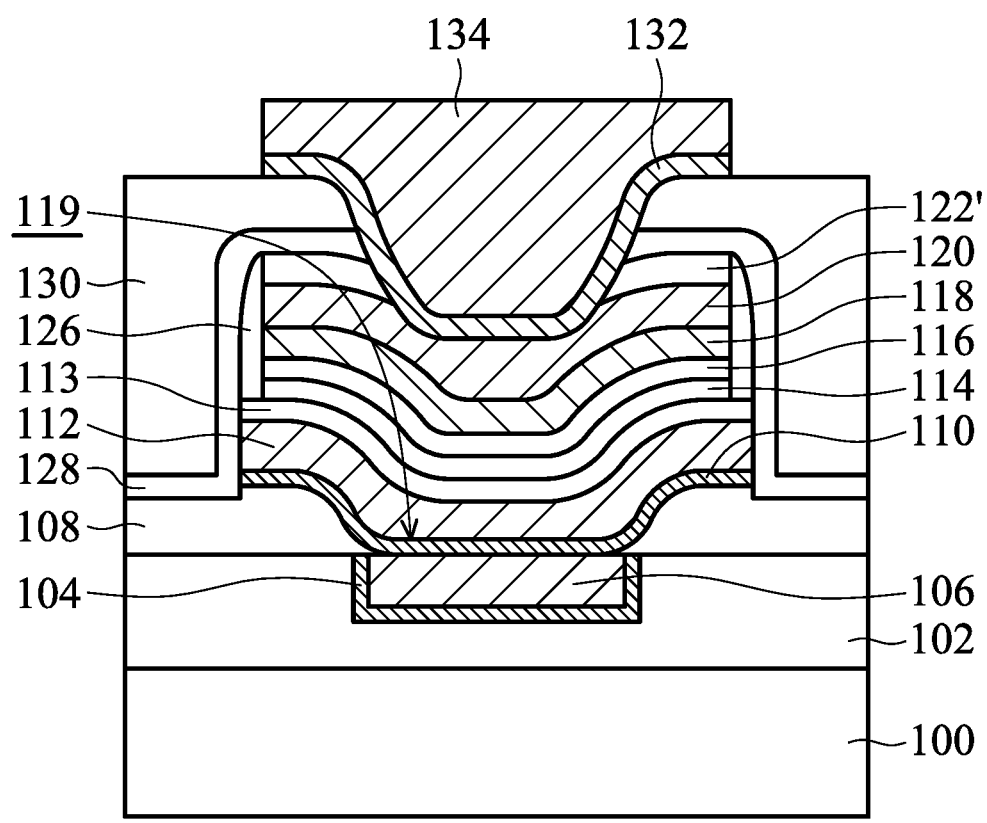
FIG. 2 is a cross-sectional view of a semiconductor device structure, in accordance with some embodiments.

Many variations and/or modifications can be made to embodiments of the disclosure. FIG. 2 is a cross-sectional view of a semiconductor device structure, in accordance with some embodiments. In some embodiments, a structure the same as or similar to that shown in FIG. 1A is provided or received. In some embodiments, before the lower electrode layer (such as the conductive layer 112) is formed, the dielectric layer 108 is formed over the semiconductor substrate 100. Afterwards, the opening 109 is formed in the dielectric layer 108. In some embodiments, the barrier layer 110 and the conductive layer 112 are formed. Portions of the barrier layer 110 and the conductive layer 112 extends into the opening 109. In some embodiments, the conductive layer 112 is not planarized. Therefore, the conductive layer 112 includes a curved upper surface. In some embodiments, the subsequently formed layers 113, 114, 116, 118, and 120 also include curved upper surfaces accordingly, as shown in FIG. 2.

Figure 3:
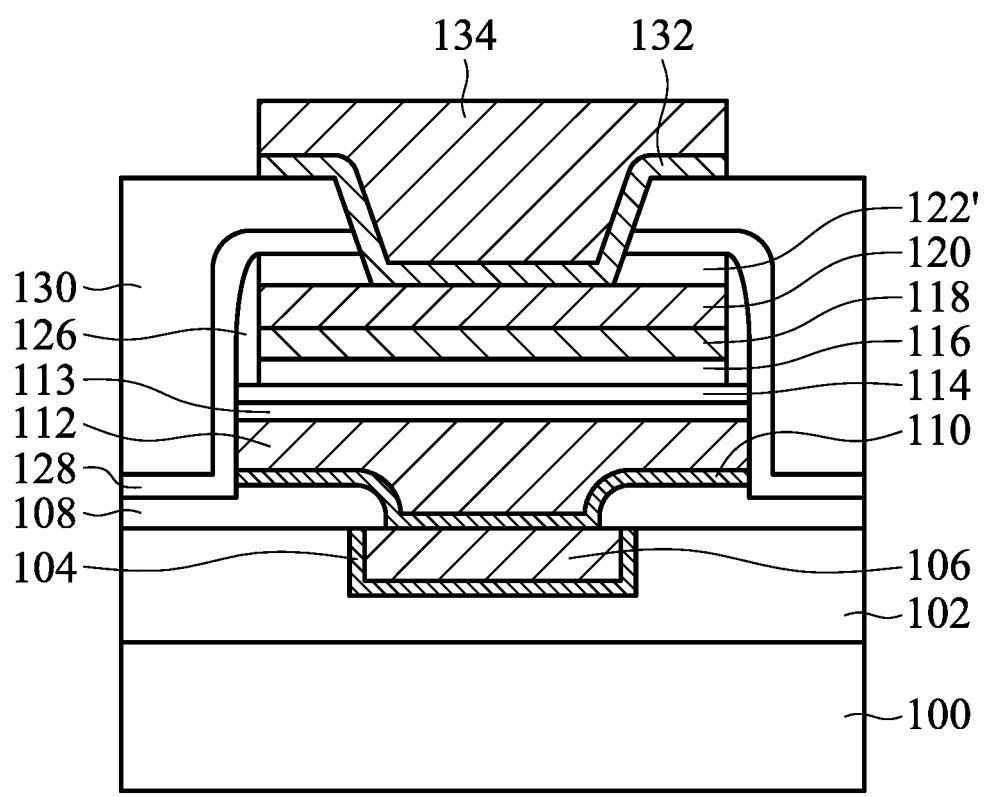
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments. In some embodiments, an etching process similar to that shown in FIG. 1E is performed. However, the resistance variable layer 114 is substantially not etched. As shown in FIG. 3, the subsequently formed protective element 126 covers the sidewall of the resistance variable layer 116. The protective element 126 does not cover the sidewall of the resistance variable layer 114 or 113. In some embodiments, the bottom surface of the protective element 126 is substantially coplanar with the top surface of the resistance variable layer 114.

Figure 4:
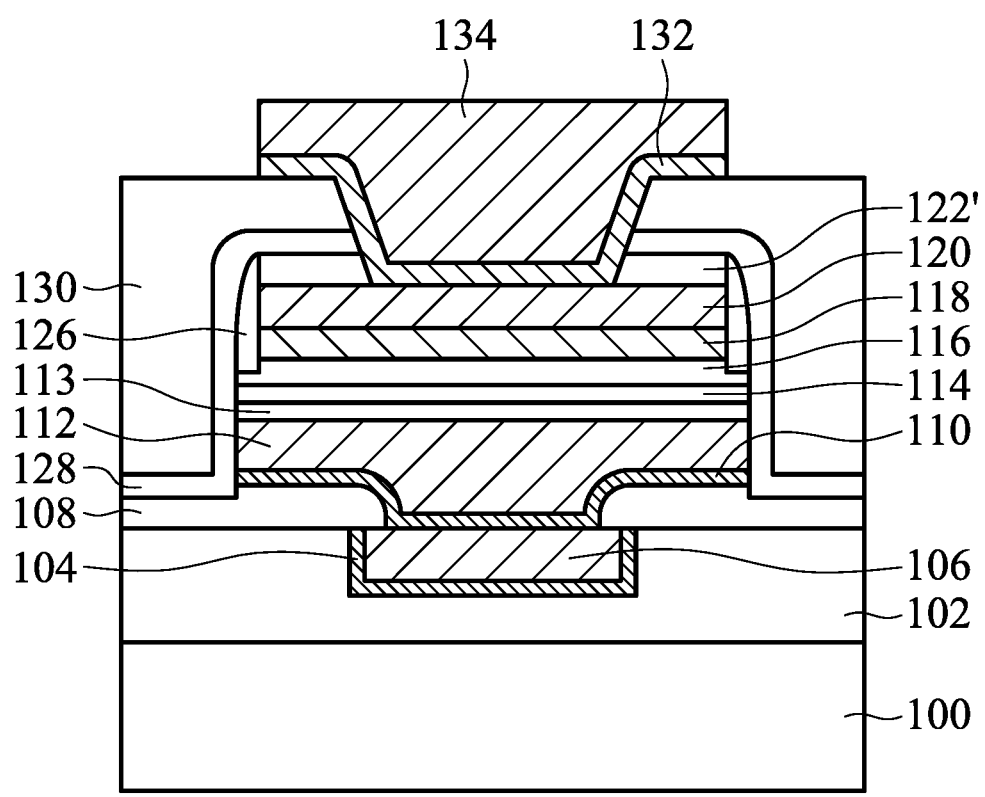
FIG. 4 is a cross-sectional view of a semiconductor device structure, in accordance with some embodiments.

Many variations and/or modifications can be made to embodiments of the disclosure. FIG. 4 is a cross-sectional view of a semiconductor device structure, in accordance with some embodiments. In some embodiments, the protective element 126 covers a portion of the sidewall of the resistance variable layer 116. In some embodiments, the bottom surface of the protective element 126 is higher than the bottom surface of the resistance variable layer 116 and lower than the top surface of the resistance variable layer 116.

Figure 5:
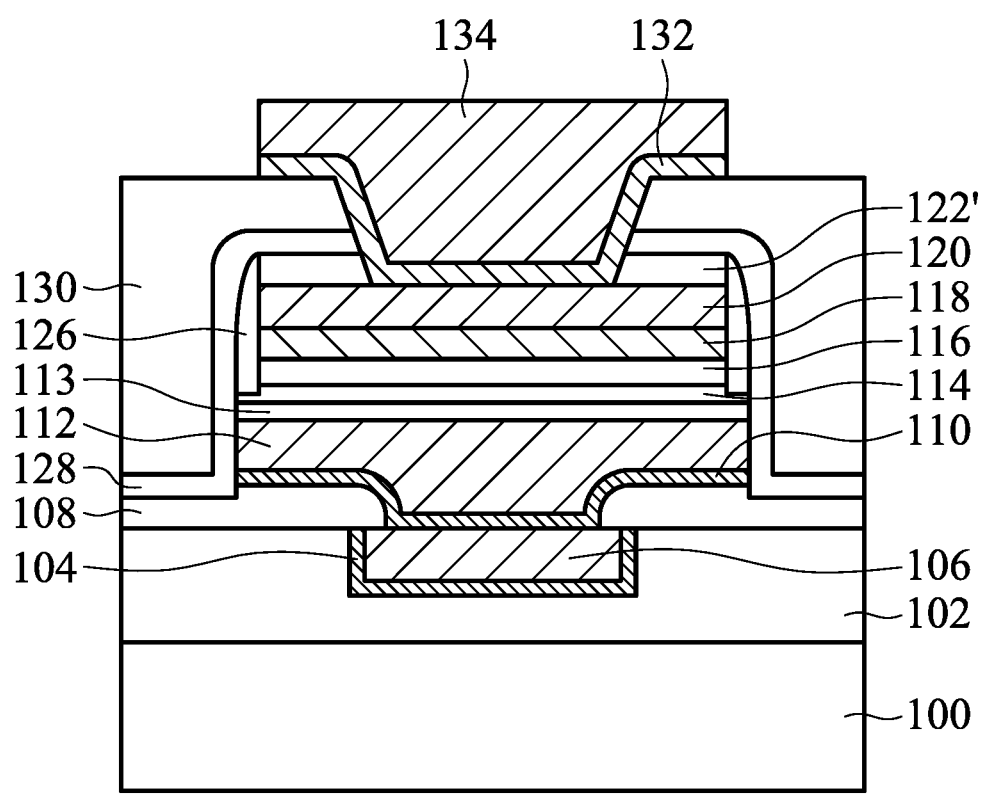
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure, in accordance with some embodiments. In some embodiments, the protective element 126 covers a portion of the sidewall of the resistance variable layer 114. In some embodiments, the protective element 126 covers the sidewall of the resistance variable layer 116. In some embodiments, the bottom surface of the protective element 126 is higher than the bottom surface of the resistance variable layer 114 and lower than the top surface of the resistance variable layer 114.

Figure 6:
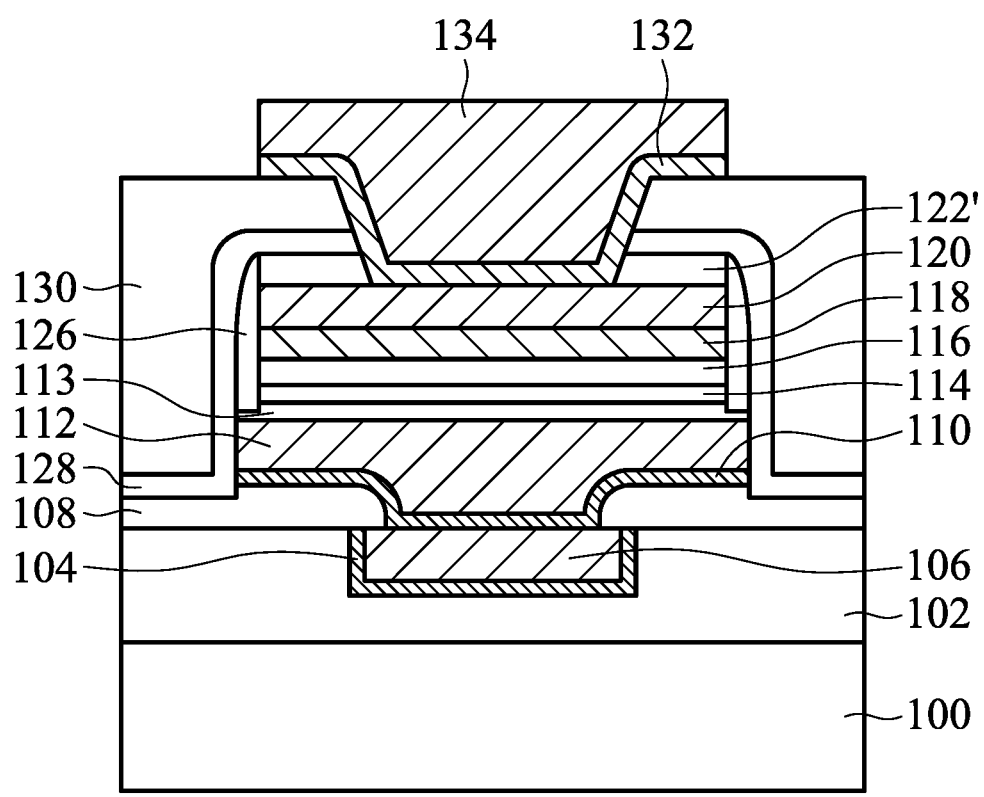
FIG. 6 is a cross-sectional view of a semiconductor device structure, in accordance with some embodiments.

Many variations and/or modifications can be made to embodiments of the disclosure. FIG. 6 is a cross-sectional view of a semiconductor device structure, in accordance with some embodiments. In some embodiments, the protective element 126 covers a portion of the sidewall of the resistance variable layer 113. In some embodiments, the protective element 126 covers the sidewalls of the resistance variable layers 114 and 116. In some embodiments, the bottom surface of the protective element 126 is higher than the bottom surface of the resistance variable layer 113 and lower than the top surface of the resistance variable layer 113.

Embodiments of the disclosure form a semiconductor device including a resistive random access memory (RRAM) structure. The RRAM structure includes three or more resistance variable layers which are sandwiched between a lower electrode and an upper electrode. The three or more resistance variable layers may have different compositions which correspond to different characteristics. For example, oxygen ions in the middle resistance variable layer may be bonded more tightly than those in the lower or upper resistance variable layer. Due to the multiple resistance variable layers, the leakage current may be significantly reduced, which leads to a better switching control. Therefore, the quality and reliability of the semiconductor device structure are significantly improved.

In accordance with some embodiments, a semiconductor device structure is provided. The semiconductor device structure includes a semiconductor substrate and a lower electrode over the semiconductor substrate. The semiconductor device structure also includes a first oxide layer over the lower electrode. The first oxide layer contains a first element and a second element other than the first element. The first element is selected from one of a first group of elements comprising aluminum, silicon, tantalum, yttrium, and vanadium. The second element is selected from one of a second group of elements comprising zirconium, hafnium, titanium, lanthanum, and tantalum. The semiconductor device structure further includes a second oxide layer over the first oxide layer. The second oxide layer contains a third element and a fourth element other than the third element. The third element is selected from one of the first group of elements, and the fourth element is selected from one of the second group of elements. In addition, the semiconductor device structure includes a third oxide layer over the second oxide layer. The third oxide layer contains a fifth element and a sixth element other than the fifth element. The fifth element is selected from one of the first group of elements, and the sixth element is selected from one of the second group of elements. An atomic concentration of the third element of the second oxide layer is greater than an atomic concentration of the first element of the first oxide layer or an atomic concentration of the fifth element of the third oxide layer. The semiconductor device structure also includes an upper electrode over the third oxide layer.

In accordance with some embodiments, a semiconductor device structure is provided. The semiconductor device structure includes a semiconductor substrate and a lower electrode over the semiconductor substrate. The semiconductor device structure also includes a first resistance variable layer over the lower electrode, a second resistance variable layer over the first resistance variable layer, and a third resistance variable layer over the second resistance variable layer. Each of the first resistance variable layer, the second resistance variable layer, and the third resistance variable layer is an oxide material containing a first element and a second element. A bonding strength between the first element and oxygen is greater than a bonding strength between the second element and oxygen. The second resistance variable layer has a greater atomic concentration of the first element than that of the first resistance variable layer or that of the second resistance variable layer. The semiconductor device structure further includes an upper electrode over the third resistance variable layer.

In accordance with some embodiments, a semiconductor device structure is provided. The semiconductor device structure includes a semiconductor substrate and a lower electrode over the semiconductor substrate. The semiconductor device structure also includes a first oxide layer over the lower electrode, a second oxide layer over the first oxide layer, and a third oxide layer over the second oxide layer. Oxygen ions are bonded more tightly in the second oxide layer than those in the first oxide layer or in the third oxide layer. The semiconductor device structure further includes an upper electrode over the third oxide layer.

In accordance with some embodiments, a semiconductor device structure is provided. The semiconductor device structure includes a semiconductor substrate and a lower electrode over the semiconductor substrate. The semiconductor device structure also includes a first oxide layer over the lower electrode. The first oxide layer contains a first element and a second element other than the first element. The first element is selected from one of a first group of elements comprising aluminum, silicon, tantalum, yttrium, and vanadium. The second element is selected from one of a second group of elements comprising zirconium, hafnium, titanium, lanthanum, and tantalum. The semiconductor device structure further includes a second oxide layer over the first oxide layer. The second oxide layer contains a third element and a fourth element other than the third element, the third element is selected from one of the first group of elements, and the fourth element is selected from one of the second group of elements. In addition, the semiconductor device structure includes a third oxide layer over the second oxide layer. The third oxide layer contains a fifth element and a sixth element other than the fifth element, the fifth element is selected from one of the first group of elements, the sixth element is selected from one of the second group of elements. An atomic concentration of the third element of the second oxide layer is greater than an atomic concentration of the first element of the first oxide layer, and the atomic concentration of the third element of the second oxide layer is greater than an atomic concentration of the fifth element of the third oxide layer. The semiconductor device structure also includes an upper electrode over the third oxide layer.

In accordance with some embodiments, a semiconductor device structure is provided. The semiconductor device structure includes a semiconductor substrate and a lower electrode over the semiconductor substrate. The semiconductor device structure also includes a storage element over the lower electrode. The storage element includes a first resistance variable region over the lower electrode, a second resistance variable region over the first resistance variable region, and a third resistance variable region over the second resistance variable region. Each of the first resistance variable region, the second resistance variable region, and the third resistance variable region is made of an oxide material containing a first element and a second element. A bonding strength between the first element and oxygen is greater than a bonding strength between the second element and oxygen. The second resistance variable region has a greater atomic concentration of the first element than that of the first resistance variable region, and the second resistance variable region has a greater atomic concentration of the first element than that of the third resistance variable region. The semiconductor device structure further includes an upper electrode over the storage element.

In accordance with some embodiments, a semiconductor device structure is provided. The semiconductor device structure includes a semiconductor substrate and a lower electrode over the semiconductor substrate. The semiconductor device structure also includes a first oxide layer over the lower electrode, a second oxide layer over the first oxide layer, and a third oxide layer over the second oxide layer. Oxygen ions are bonded more tightly in the second oxide layer than those in the first oxide layer, and oxygen ions are bonded more tightly in the second oxide layer than those in the third oxide layer. The semiconductor device structure further includes an upper electrode over the third oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a lower electrode over the semiconductor substrate;
   a first oxide layer over the lower electrode, wherein the first oxide layer contains a first element and a second element other than the first element, the first element is selected from one of a first group of elements comprising aluminum, silicon, tantalum, yttrium, and vanadium, and the second element is selected from one of a second group of elements comprising zirconium, hafnium, titanium, lanthanum, and tantalum;
   a second oxide layer over the first oxide layer, wherein the second oxide layer contains a third element and a fourth element other than the third element, the third element is selected from one of the first group of elements, and the fourth element is selected from one of the second group of elements;
   a third oxide layer over the second oxide layer, wherein the third oxide layer contains a fifth element and a sixth element other than the fifth element, the fifth element is selected from one of the first group of elements, the sixth element is selected from one of the second group of elements, an atomic concentration of the third element of the second oxide layer is greater than an atomic concentration of the first element of the first oxide layer, and the atomic concentration of the third element of the second oxide layer is greater than an atomic concentration of the fifth element of the third oxide layer; and
   an upper electrode over the third oxide layer.

2. The semiconductor device structure as claimed in claim 1, wherein the third oxide layer is thicker than the second oxide layer, and the third oxide layer is thicker than the first oxide layer.

3. The semiconductor device structure as claimed in claim 1, wherein the second oxide layer is in direct contact with the first oxide layer and the third oxide layer.

4. The semiconductor device structure as claimed in claim 1, wherein the first element, the third element, and the fifth element are a same element selected from one of the first group of elements.

5. The semiconductor device structure as claimed in claim 1, wherein at least two of the first element, the third element, and the fifth element are different elements selected from two or more of the first group of elements.

6. The semiconductor device structure as claimed in claim 1, wherein a ratio of the atomic concentration of the third element of the second oxide layer to an atomic concentration of the fourth element of the second oxide layer is in a range from about 1.2 to about 4.

7. The semiconductor device structure as claimed in claim 1, wherein:
   a ratio of the atomic concentration of the first element of the first oxide layer to an atomic concentration of the second element of the first oxide layer is in a range from about 0.25 to about 1, and
   a ratio of the atomic concentration of the fifth element of the third oxide layer to an atomic concentration of the sixth element of the third oxide layer is in a range from about 0.25 to about 1.

8. The semiconductor device structure as claimed in claim 1, further comprising a metal capping layer between the third oxide layer and the upper electrode.

9. The semiconductor device structure as claimed in claim 8, wherein the metal capping layer is in direct contact with the third oxide layer.

10. The semiconductor device structure as claimed in claim 1, further comprising a protective element, wherein the protective element covers a side surface of the second oxide layer and a side surface of the third oxide layer.

11. The semiconductor device structure as claimed in claim 10, wherein the protective element extends into the first oxide layer such that a bottom surface of the protective element is between a top surface of the first oxide layer and a top surface of the semiconductor substrate.

12. A semiconductor device structure, comprising:
   a semiconductor substrate;
   a lower electrode over the semiconductor substrate;
   a storage element over the lower electrode, wherein the storage element comprises:

a first resistance variable region over the lower electrode;

a second resistance variable region over the first resistance variable region;

a third resistance variable region over the second resistance variable region, wherein each of the first resistance variable region, the second resistance variable region, and the third resistance variable region is made of an oxide material containing a first element and a second element, a bonding strength between the first element and oxygen is greater than a bonding strength between the second element and oxygen, the second resistance variable region has a greater atomic concentration of the first element than that of the first resistance variable region, and the second resistance variable region has a greater atomic concentration of the first element than that of the third resistance variable region; and an upper electrode over the storage element.

13. The semiconductor device structure as claimed in claim 12, wherein:

the first element comprises aluminum, silicon, tantalum, yttrium, or vanadium, and the second element comprises zirconium, hafnium, titanium, lanthanum, or tantalum.

14. The semiconductor device structure as claimed in claim 12, wherein:

a ratio of an atomic concentration of the first element of the second resistance variable layer to an atomic concentration of the second element of the second resistance variable layer is in a range from about 1.2 to about 4, a ratio of an atomic concentration of the first element of the first resistance variable layer to an atomic concentration of the second element of the first resistance variable layer is in a range from about 0.25 to about 1, and a ratio of an atomic concentration of the first element of the third resistance variable layer to an atomic concentration of the second element of the third resistance variable layer is in a range from about 0.25 to about 1.

15. The semiconductor device structure as claimed in claim 12, wherein a ratio of a thickness of the third resistance variable region to a thickness of the second resistance variable region is in a range from about 1.2 to about 2.

16. The semiconductor device structure as claimed in claim 12, wherein the second resistance variable region is in direct contact with the first resistance variable region and the third resistance variable region.

17. The semiconductor device structure as claimed in claim 12, further comprising a metal capping layer between the third resistance variable region and the upper electrode, wherein the metal capping layer is in direct contact with the third resistance variable region.

18. A semiconductor device structure, comprising:
a semiconductor substrate;
a lower electrode over the semiconductor substrate;
a first oxide layer over the lower electrode;
a second oxide layer over the first oxide layer; and
a third oxide layer over the second oxide layer, wherein oxygen ions are bonded more tightly in the second oxide layer than those in the first oxide layer, and oxygen ions are bonded more tightly in the second oxide layer than those in the third oxide layer, wherein:

the first oxide layer contains a first element and a second element, the first element and the second element are different from each other, the first element is selected from one of a first group of elements comprising aluminum, silicon, tantalum, yttrium, and vanadium, the second element is selected from one of a second group of elements comprising zirconium, hafnium, titanium, lanthanum, and tantalum, the second oxide layer contains a third element and a fourth element, the third element and the fourth element are different from each other, the third element is selected from one of the first group of elements, the fourth element selected from one of the second group of elements, the third oxide layer contains a fifth element and a sixth element, the fifth element and the sixth element are different from each other, the fifth element is selected from one of the first group of elements, the sixth element selected from one of the second group of elements, an atomic concentration of the third element of the second oxide layer is greater than an atomic concentration of the first element of the first oxide layer, and the atomic concentration of the third element of the second oxide layer is greater than an atomic concentration of the fifth element of the third oxide layer.

19. The semiconductor device structure as claimed in claim 18, further comprising a protective layer covering a side surface of the first oxide layer and the protective element.

20. The semiconductor device structure as claimed in claim 18, further comprising:

a protective element covering a side surface of the third oxide layer, wherein a bottom surface of the protective element is between a top surface of the semiconductor substrate and a top surface of one of the first oxide layer, the second oxide layer, and the third oxide layer; and an upper electrode over the third oxide layer, wherein the bottom surface of the protective element is between a bottom surface of the first oxide layer and a bottom surface of the upper electrode.

* * * * *